United States Patent [19]
Moslehi et al.

[11] Patent Number: 5,871,588
[45] Date of Patent: Feb. 16, 1999

[54] PROGRAMMABLE ULTRACLEAN ELECTROMAGNETIC SUBSTRATE ROTATION APPARATUS AND METHOD FOR MICROELECTRONICS MANUFACTURING EQUIPMENT

[75] Inventors: Mehrdad M. Moslehi, Los Altos; Yong Jin Lee, San Jose, both of Calif.

[73] Assignee: CVC, Inc.

[21] Appl. No.: 677,980

[22] Filed: Jul. 10, 1996

Related U.S. Application Data

[60] Provisional application No. 60/001,003, Jul. 10, 1995.

[51] Int. Cl.$^6$ .................................................. C23C 16/00
[52] U.S. Cl. ........................... 118/730; 118/500; 156/345
[58] Field of Search ...................... 118/730, 728, 118/50.1, 500; 204/298.28

[56] References Cited

U.S. PATENT DOCUMENTS

| | | | |
|---|---|---|---|
| 4,210,831 | 7/1980 | Hurst | 310/13 |
| 4,275,371 | 6/1981 | Vogel | 335/272 |
| 4,789,771 | 12/1988 | Robinson et al. | 219/405 |
| 5,113,102 | 5/1992 | Gilmore | 310/88 |
| 5,155,336 | 10/1992 | Gronet et al. | 219/411 |
| 5,444,217 | 8/1995 | Moore et al. | 219/405 |
| 5,468,299 | 11/1995 | Tsai | 118/730 |

FOREIGN PATENT DOCUMENTS

| | | |
|---|---|---|
| 193113 | 4/1989 | Japan . |
| 53157 | 1/1993 | Japan . |
| 547696 | 2/1993 | Japan . |

OTHER PUBLICATIONS

McGraw–Hill Encyclopedia of Science and Technology, vol. 6, 1992, Jerome Meisel, "Electromagnet" pp. 154–155.

PCT Written Opinion; Mailing Date Jun. 4, 1997.

Primary Examiner—Bruce Breneman
Assistant Examiner—Luz Alejandro
Attorney, Agent, or Firm—Gray Cary Ware & Freidenrich LLP

[57] ABSTRACT

An apparatus and method for wafer rotation in microelectronics manufacturing equipment is presented. The present invention combines an external stator assembly having a plurality of electromagnetic actuator coils with an internal rotor assembly having a plurality of multipolar permanent magnets or ferromagnetic coupling tabs. The rotor assembly supports the semiconductor wafer or any other substrate inside the process chamber. The electromagnetic actuator coils of the stator assembly receive a plurality of multiphase, controlled frequency electrical currents to create magnetic fields around the actuator coils that interact with the multipolar permanent magnets or ferromagnetic coupling tabs of the rotor assembly to provide the rotational force to rotate the rotor assembly and thus, rotate the semiconductor wafer or any other substrate within the process chamber.

41 Claims, 5 Drawing Sheets

PROGRAMMABLE ULTRACLEAN ELECTROMAGNETIC SUBSTRATE ROTATION APPARATUS AND METHOD FOR MICROELECTRONICS MANUFACTURING EQUIPMENT

RELATED APPLICATION

This application claims priority under 35 USC § 119(e)(1) to provisional application number 60/001003, filed Jul. 10, 1995.

TECHNICAL FIELD OF THE INVENTION

The present invention relates to a method and system for microelectronics device fabrication equipment and, more particularly, to an apparatus and method for wafer rotation in semiconductor manufacturing equipment.

BACKGROUND OF THE INVENTION

Semiconductor integrated circuit manufacturing technologies utilize many single-wafer thermal, deposition, and plasma etch clean process steps through the chip fabrication process flows. Semiconductor wafer temperature and overall process uniformity are important requirements in semiconductor manufacturing equipment in order to maximize device manufacturing yield. In particular, precision wafer temperature uniformity and repeatability are essential requirements in thermal processing equipment including rapid thermal processing (RTP) systems. For instance, rapid thermal anneal (RTA), rapid thermal oxidation (RTO), and rapid thermal chemical-vapor deposition (RTCVD) processes must provide dynamically uniform and repeatable wafer temperatures with within-wafer temperature non-uniformities and wafer-to-wafer temperature variations of less than ±5° C. in most thermal processes for sub-half-micron semiconductor IC production. Moreover, chemical-vapor deposition (CVD) processes must provide high-quality material layers (such as polysilicon, amorphous silicon, epitaxial silicon, silicon nitride, silicone dioxide, etc.) with uniform and repeatable material layer thicknesses. This places a demand for not only wafer temperature uniformity and repeatability control, but also reactant mass transport uniformity across the semiconductor wafer or any other substrate (e.g., then-film head, flat-panel display, etc.).

One effective method to establish improved wafer temperature uniformity and also improved reactant mass transport uniformity in single-wafer fabrication equipment is wafer rotation during wafer processing. For instance, wafer rotation in an RTP equipment can result in axisymmetrical wafer temperature distribution with improved temperature uniformity and enhanced repeatability. Moreover, wafer rotation in RTCVD and single-wafer plasma-enhanced CVD (PECVD) systems is effective in establishing an axisymmetrical reactant mass transport distribution profile over the wafer with improved deposition process uniformity, including uniform material layer thickness distribution.

Another application of wafer rotation in semiconductor manufacturing equipment is deposition rate enhancement in CVD Rotating Disk Reactor (RDR) systems. The typical wafer rotation speeds for temperature and process uniformity improvements are in the range of 20 RPM to 200 RPM (RPM=Revolutions per Minute). The RDR CVD systems, however, employ much higher wafer rotation speeds, typically in the range of 500 to over 1500 RPM. These relatively high rotation speeds are required in order to increase the material deposition rate in certain CVD process applications by reducing the boundary layer (stagnant layer) thickness, particularly for mass-transport-limited deposition processes.

The wafer rotation methods in single-wafer manufacturing equipment typically employ external rotation motors in conjunction with ferrofluidic feedthroughs. A ferrofluidic feedthrough provides a rotatable shaft wherein one end of the shaft can be placed within the process chamber (e.g., vacuum process chamber) while the other end of the shaft can be placed on the atmospheric side outside the process chamber. An electrical motor applies rotation to the ferrofluidic feedthrough shaft outside the fabrication equipment process chamber. This rotation is performed through direct mechanical transfer through to the ferrofluidic feedthrough shaft terminal located inside the fabrication equipment process chamber. The ferrofluidic shaft is connected to the wafer holder, or wafer susceptor or any wafer support structure, resulting in wafer rotation. This wafer rotation configuration has several disadvantages in terms of equipment reliability and performance.

Generally, ferrofluidic feedthroughs present a problem due to their limited life in operation. Wafer rotation mechanisms with ferrofluidic feedthroughs can also generate particulates in the process chamber, resulting in a reduction of the manufacturing yield due to an increase in chip defect density.

In vacuum or low-pressure CVD applications, the ferrofluidic feedthrough can also cause vacuum integrity problems and possible vacuum base pressure degradation over extended operation.

In RTP systems, the use of ferrofluidic feedthroughs for wafer rotation also has some obvious disadvantages and constraints. For instance, a typical ferrofluidic rotation assembly will consume the much needed space below the wafer backside. As a result, this type of wafer rotation eliminates availability of an access port facing the wafer backside, placing a serious constraint on equipment design.

Figure 1:
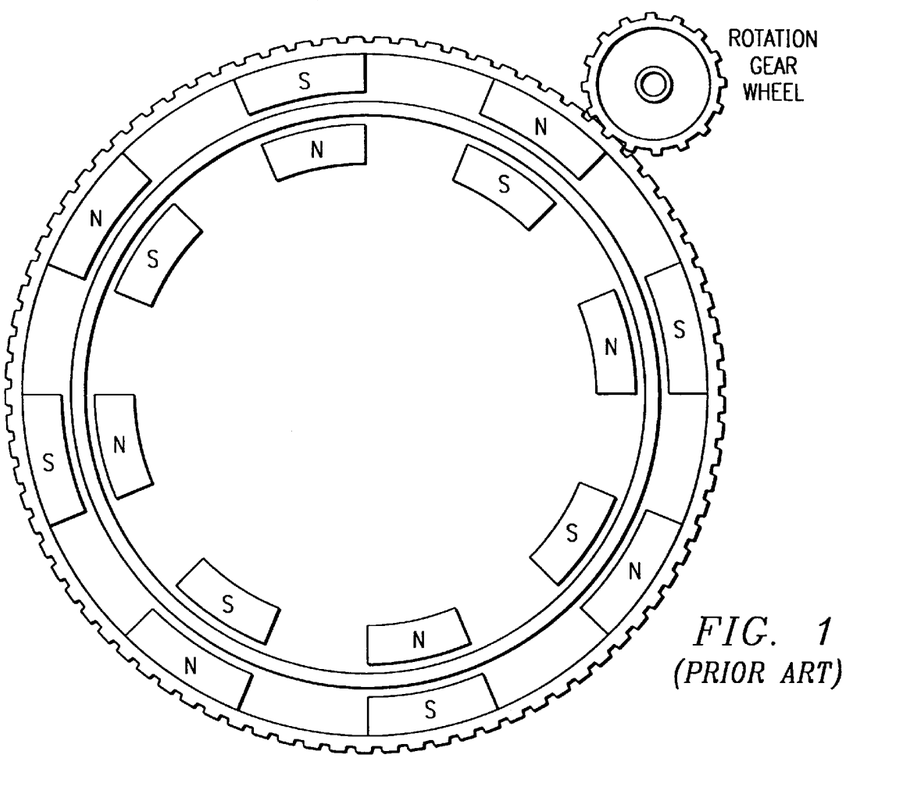
FIG. 1 shows a schematic view of a prior art multipolar rotation design for rotating wafers.

An alternative method for wafer rotation was developed in the Microelectronics Manufacturing Science and Technology (MMST) program at Texas Instruments Incorporated for use in RTP systems. Both inventors of the present invention, Mehrdad M. Moslehi and Yong Jin Lee, were members of the MMST team who developed the Advanced-Vacuum Processor RTP or AVP RTP system. The MMST RTP rotation assembly was designed based on the use of two multipolar magnetic wheels, as schematically shown in FIG. 1. The internal multipolar magnetic field contains an even number of preferably radially magnetized magnets with alternating poles. These magnets are mounted on a soft magnetic material ring composed of a permeable magnetic material such as nickel-plated iron, 400 series stainless steel, or 1018 steel. The internal multipolar magnet wheel is attached to the wafer holder and a quartz or metallic liner (or wafer support structure) supported on a circular or ring-shaped mechanical bearing assembly. The rotation motor rotates the external magnet wheel through a gear coupling mechanism. Rotation of the external magnet wheel results in rotation of the internal magnet wheel due to the strong magnetic field coupling between the two sets of multipolar permanent magnets through the process chamber well. Rotation of the internal multipolar magnet wheel results in wafer rotation through rotation of the wafer support assembly.

The multipolar magnet rotation has an important advantage over the ferrofluidic feedthrough rotation since it does not employ a ferrofluidic feedthrough. As a result, the multipolar rotation assembly is a more reliable method of wafer rotation in semiconductor manufacturing equipment, including single-wafer vacuum and atmospheric fabrication equipment. Another advantage of the multipolar rotation design is the fact that it does not need to occupy the spaces directly above or below the semiconductor wafer. Thus, the regions directly above and below the wafer can be used for implementation of process energy sources as well as other fabrication equipment components and subassemblies.

However, this multipolar rotation design, like the other prior wafer rotation methods and devices, still presents the disadvantage of having mechanically moving parts outside the fabrication process chamber in the manufacturing clean room. These mechanical parts, such as the motor, motor shaft, and rotating gears, can be sources of equipment reliability and downtime problems as well as generators of particulates. Generation of particulates due to external mechanical motion and rotational friction can degrade the clean room cleanliness and class around the fabrication equipment.

SUMMARY OF THE INVENTION

Therefore a need has arisen for a wafer rotation apparatus and method that eliminates the need for mechanically rotating parts, such as rotational feedthroughs and rotational motors, outside the fabrication equipment process chamber.

A further need exists for a wafer rotation apparatus and method that substantially eliminates particulate formation from moving mechanical parts.

A further need exists for a wafer rotation apparatus and method that is compatible with ultra-high vacuum (UHV) base pressure requirements of vacuum and low-pressure fabrication equipment systems such as rapid thermal CVD (RTCVD) and plasma-enhanced CVD (PECVD) equipment.

A further need exists for a wafer rotation apparatus and method that has the capability to meet the stringent operational reliability and uptime requirements of semiconductor manufacturing equipment.

In accordance with the present invention, a wafer rotation apparatus and method is provided that substantially eliminates or reduces disadvantages and problems associated with previously developed wafer rotation devices and methods.

More specifically, a wafer rotation system so-called Gearless Rotation system is provided that rotates semiconductor wafers in semiconductor manufacturing equipment. The system of the present invention combines an external stator assembly having a plurality of electromagnetic actuator coils with an internal rotor assembly having a plurality of multipolar permanent magnets. The permanent magnets can be replaced by an array of ferromagnetic material pole pieces. The internal rotor assembly supports the semiconductor wafer or any other substrate within the fabrication equipment process chamber. The electromagnetic actuator coils of the external stator assembly receive controlled frequency and controlled phase electrical currents to create time varying magnetic fields around the actuator coils that interact with the magnetic fields of the multipolar permanent magnets (or with the permeable ferromagnetic pole pieces) of the rotor assembly to provide the rotational force and torque to rotate the internal rotor assembly and thus, rotate the semiconductor wafer or any other substrate within said process chamber.

Also provided is a wafer rotation method that allows rotation of semiconductor wafers or any other substrates in microelectronic manufacturing equipment having an external stator assembly and an internal rotor assembly. The method of the present invention includes securing a semiconductor wafer or any other substrate to the internal rotor assembly, coupling a plurality of multipolar permanent magnets (or a plurality of permeable ferromagnetic pieces) to the rotor assembly, coupling a plurality of actuator coils to the external stator assembly, applying a plurality of electrical currents to the actuator coils to create time varying magnetic fields around each of the actuator coils, and positioning the external stator assembly in a proximity position relative to the rotor assembly to cause the interaction of the magnetic fields of the actuator coils with the magnetic fields of the multipolar magnets (or with the permeable ferromagnetic pole pieces on the rotor assembly) to force the rotor assembly to rotate. The interaction of the stator coils with ferromagnetic material pole pieces can also be used to generate rotation.

An important technical advantage of the present invention is that eliminates the need for mechanically moving and rotating parts, such as rotational feedthroughs, rotational motors, and rotating gears, outside the fabrication equipment process chamber.

The present invention provides another technical advantage by eliminating particulate generated from moving mechanical parts inside the fabrication clean room.

The present invention provides yet another technical advantage as being compatible with ultra-high vacuum (UHV) base pressure requirements of vacuum and low-pressure fabrication equipment systems.

Still another technical advantage of the present invention is the increased capability to meet the stringent reliability and uptime requirements of semiconductor manufacturing equipment.

Yet another technical advantage of the present invention is its ability to be easily integrated into a fabrication equipment without occupying the spaces directly above or below the wafer, thereby making these spaces are available for implementation of other process energy sources subassemblies, such as a multi-zone illuminator for RTP systems for wafer backside heating.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

The present invention uses an external electromagnetic stator assembly in conjunction with a multipolar permanent magnet rotor assembly or a rotor assembly with multiple permeable or ferromagnetic tabs instead of permanent magnets, in order to establish a capability for wafer rotation. This wafer rotation apparatus and method may be used in a numerous manufacturing applications including semiconductor, data storage, flat panel display and photovoltaic device manufacturing equipment.

Figure 2:
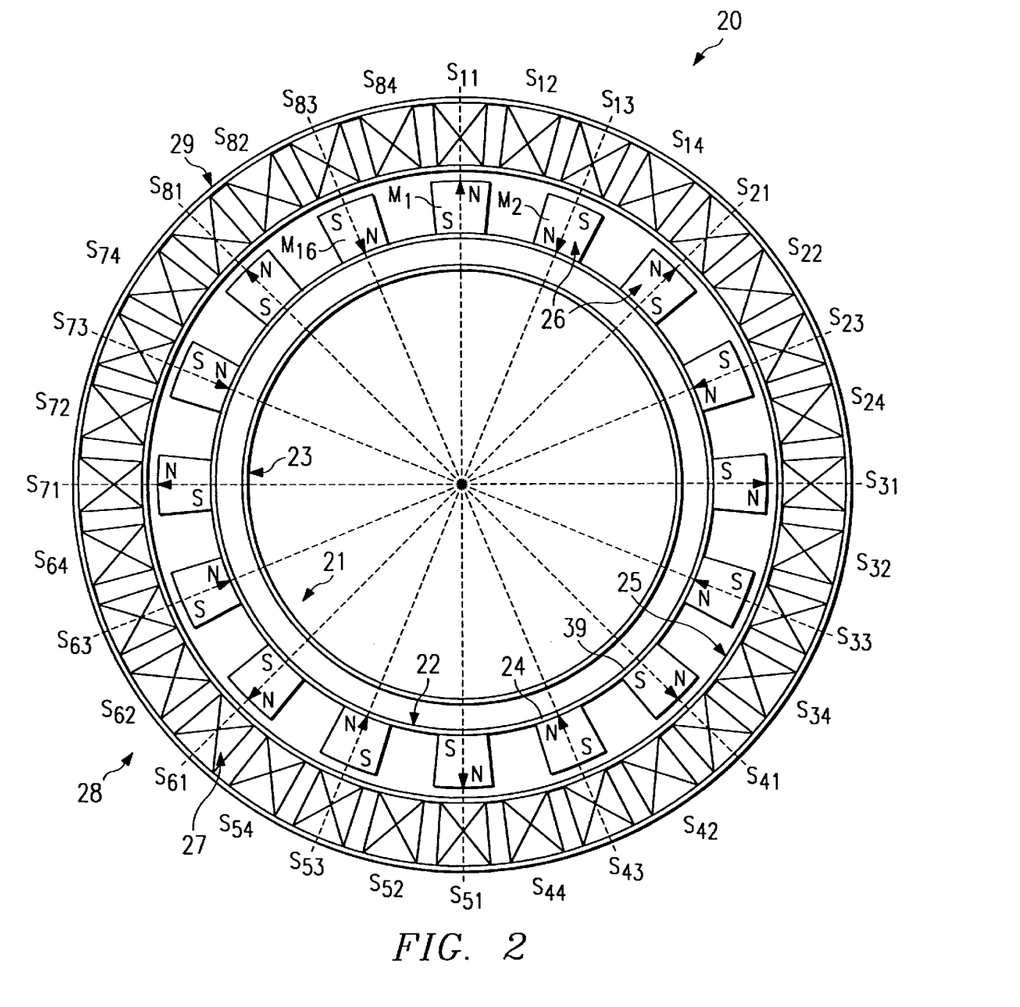
FIG. 2 shows a cross-sectional view of one embodiment of the present invention with permanent magnets on the rotor.
Figure 3:
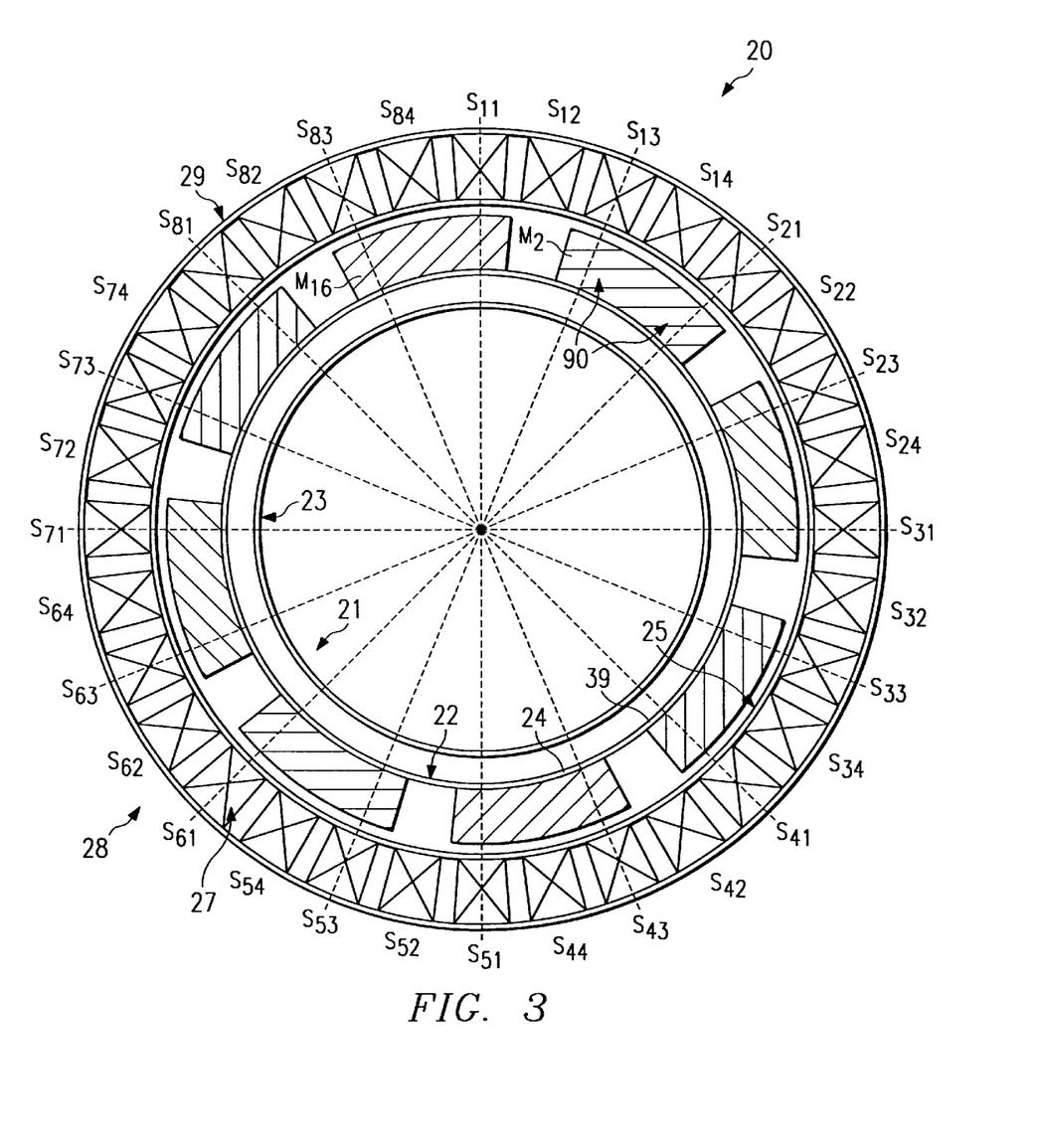
FIG. 3 shows a cross-sectional piece of another embodiment of the present invention with a plurality of permeable or ferromagnetic tabs or pole pieces mounted on the rotor.

FIGS. 2 and 3 show two slightly different embodiments of the current invention, both using a multicoil electromagnetic stator but with slightly different rotor designs.

As shown in FIGS. 2 and 3, rotation device 20 of the present invention can comprise an internal rotor assembly 22 and an external stator assembly 29. As shown in FIG. 2 the internal rotor assembly 22 further comprises a plurality of multipolar permanent magnets 26 coupled to a rotor section 24. As shown in FIG. 3, rotation can also be established using ferromagnetic tabs 90. The rotor section 24 is preferably contained within a protective rotor housing 21. The rotor housing 21 further comprises an outer rotor housing outer component 25 coupled to a rotor housing inner component 23. The rotor housing can be manufactured preferably from a variety of nonmagnetic materials including 300 series stainless steel or aluminum. The rotor section 24 preferably has a generally circular cross-sectional shape as shown in FIGS. 2 and 3 for the two slightly different embodiments. The rotor section 24 can be manufactured from a variety of magnetic materials including soft iron or 400 series magnetic steel. Alternatively, the rotor section 24 can couple to a magnetic band shaped with a circular cross-section and designed to attach snugly to the rotor section 24. As shown in FIG. 2, the magnets 26 couple to rotor section 24 by means of the magnetic force between the permanent magnets 26 and the metal of rotor section 24. Alternatively, the magnets 26 can be mechanically attached to the rotor using screws, fasteners, adhesive, or brackets. The magnets 26 are coupled to the rotor section 24 so that the magnets 26 have alternating magnetization poles (preferably radial magnetilization) facing stator 28. To illustrate as shown in FIG. 2, magnet 26 labeled $M_1$ has a north magnetic pole on the side of the magnet $M_1$ facing the stator assembly 28, and magnets 26 labeled $M_2$ and $M_{16}$ each has its south magnetic pole on the side of the magnet facing the stator 28. Thus, the permanent magnets 26 have an alternating pole pattern on the rotor section 24 (FIG. 2). On the case of ferromagnetic coupling tubes magnetic field generated by the stator coils generate the force for rotor section 24 as dipicted in FIG. 3.

Figure 4:
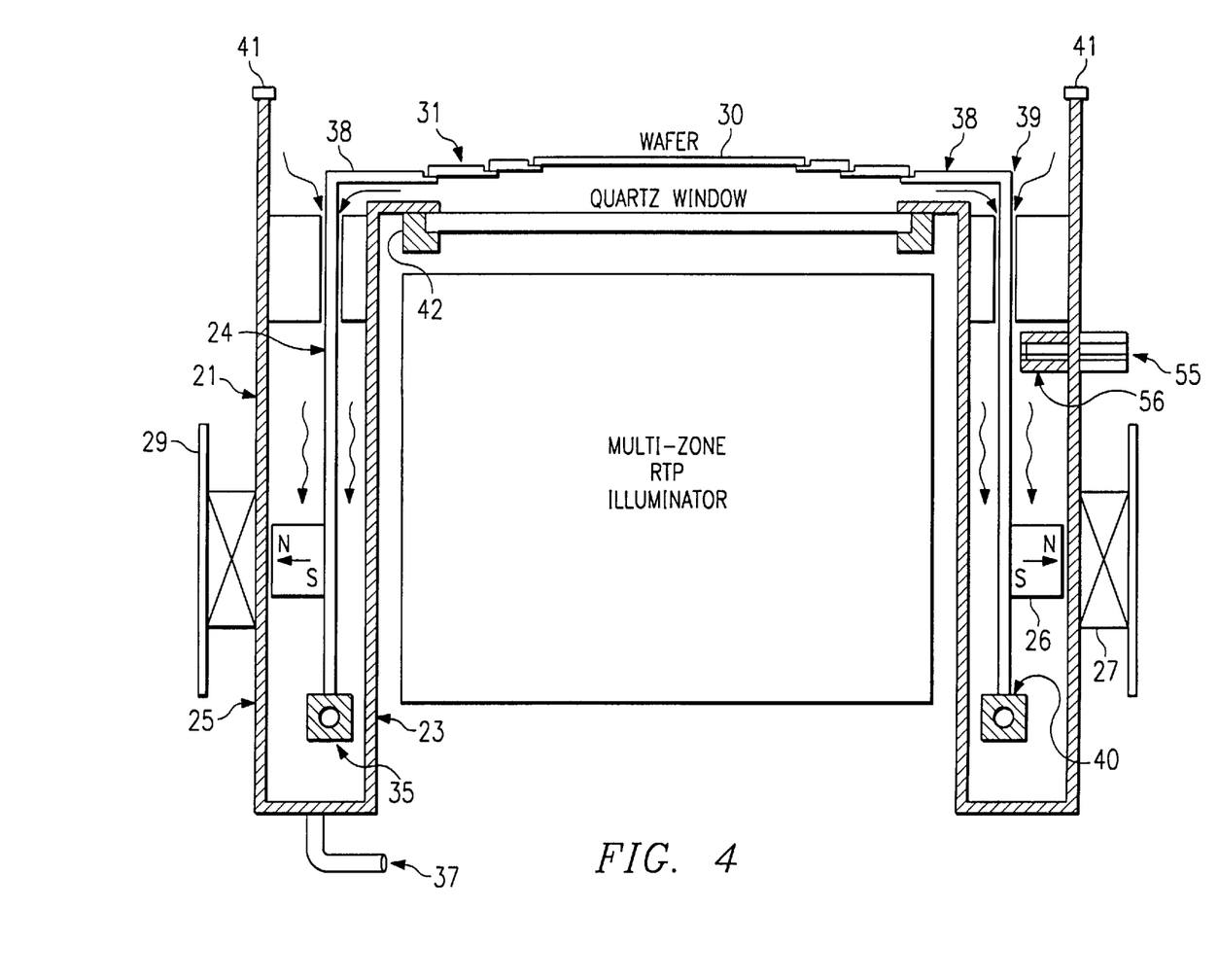
FIG. 4 shows a side view of one embodiment of the present invention, demonstrating the relative positioning of the rotation assembly of this invention with respect to the RTP illuminator and the wafer in an RTP system.

Rotor section 24 is supported on a rotational bearing 35 as shown in FIG. 4. The surface of the circular rotor section cross section, as seen from the top view of FIG. 2, can form the rotor ring support contact 39 upon which the wafer support ring 31 and extension support ring 38 rest. The circular rotor cross section opposite the rotor extension support ring 38 contact forms the rotor bearing contact for interfacing of rotor section 24 with the mechanical rotational bearing 35.

As shown in FIG. 2 and FIG. 3, the stator assembly 28 placed outside the equipment process chamber, has a generally circular cross-sectional shape and comprises a stator housing or support structure 29 and a series of stator actuator coils 27 coupled to the stator housing or support structure 29. The stator housing should preferably be made from a high-permeability magnetic material such as nickel-coated iron or magnetic steel, for example 1018 steel or 400 Series stainless steel to provide a path for the magnetic flux on one end of the electromagnet coils. The stator assembly 28 shown in FIG. 2 and in FIG. 3 is preferably placed around the rotor assembly outer housing 25 which is preferably a cylindrical metallic housing. In alternative embodiment, the stator assembly 28 can be placed within the inner housing 23. In either embodiment, the distance between the magnets and the coils (including the thickness of the rotor housing wall) should be minimized in order to maximize the rotational torque. The stator assembly 28 remains in a fixed position during operation. The stator coils 27 are fixably mounted (using mechanical fasteners) to the side of the stator housing or support structure 29 facing the magnets 26 (see FIG. 2) or the ferromagnetic tabs (see FIG. 3) of the rotor assembly 22. The stator coils of FIG. 2 or FIG. 3 contact the rotor outer housing 25 wall of the rotor assembly 22 for maximum rotational torque (alternatively, the stator coils 27 would preferably contact the rotor inner housing 23 wall if the stator 28 resided within the rotor inner housing 23). Preferably, the rotor outer housing wall 25 will have a thickness as small as manufacturing and mechanical strength constraints will allow at the positions on the rotor outer housing 25 in contact with the stator coils 27. A rotor housing thickness of two to four millimeters will work for most applications of wafer rotation. The stator coils 27 can be made by winding a suitable gauge electrical wire over a suitable core material with high magnetic permeability and low eddy current losses. As an example 16 gauge copper wires can be used for the stator coils 27.

The stator 28 should preferably be built to contain twice as many actuator coils 27 as the number of permanent magnets 26 (see FIG. 2) on the rotor assembly 22. Larger numbers of coils per ferromagnetic tabs may be optional. The preferred embodiment of the rotation assembly to be used with CVC's single-wafer equipment products employs 32 stator coils 27 and 16 multipolar permanent magnets (magnetized radially) as shown in FIG. 2.

As shown in FIG. 4, the rotor section 24 rests on the rotational mechanical bearing 35 at the rotor bearing contact portion 40 of the rotor section 24. Rotational bearing 35 can include an actuator 36 for moving the rotational bearing up and down during operation. The rotor section 24 can also support the wafer support ring 31 and extension support ring 38 (or wafer chuck) that supports the silicon wafer or any other substrate 30. Preferably, the rotor housing 21 generally resides below the wafer plane of rotation and is continuously purged through the purge gas outlet 37 with an inert gas flowing downward in order to eliminate or minimize the possibility of particulate contamination in the process chamber and around the wafer. The rotor housing 21 can be constructed so that the rotor housing contains a controlled environment, of preferably inert purge gas that is isolated from the outside environment and from the process environment (the latter via internal purge gas). The rotor housing 21 can also provide the connection flanges 41 and 42 for the outer and inner housings to a process chamber. The combination of purge gas, an isolated rotation environment, and the elimination of mechanical moving parts other than the rotor 24 and the bearing 35 greatly reduce the possibility of the buildup of particulates near the wafer 30. Moreover, this invention eliminates the need for any rotational feedthroughs such as ferrofluidic feedthroughs and relating gears or parts in the clean room. This provides the ultraclean aspect of the present invention.

In operation, a multi-phase synchronized electrical current source is applied to each of the actuator coils 27 on the stator assembly 28. When the stator coils 27 are connected to their electrical power source drivers (current or voltage sources), the stator housing 29 closes the magnetic circuits and flux lines on the outer surfaces the stator actuator coil 27 cores. The magnetized stator coils produce a time varying magnetic field around the stator periphery which interacts with the permanent magnets 26 mounted onto the rotor assembly. The magnetic field generated by the stator coils is such that the lowest energy state of the stator rotor system rotates in one direction. The speed and direction of this rotation is determined by the waveforms supplied to the coils. This interaction provides a force against all of the magnets of ferromagnetic tabs in the same direction. This force is translated from the magnets of ferromagnetic tabs to the rotor 24 positioned on the bearing 35 and causes the rotor 24 to rotate on the bearing 35. The semiconductor wafer fixably positioned on the rotor will likewise rotate due to this magnetic force interaction between the stator and rotor assemblies.

The rotation assembly 20 of the present invention uses no direct mechanical feedthrough devices to provide the force or torque to rotate the wafer during operation. The force driving the rotation of the rotor 24 is derived from electromagnetic energy and magnetic interactions between the external stator assembly and internal rotor assembly. By eliminating external moving mechanical parts and rotational feedthroughs, such as rotational ferrofluidic feedthroughs and rotational gears or wheels outside the fabrication equipment process chamber the present invention eliminate the external (clean room) and internal (process chamber) particulates generated from rotating mechanical parts (gears or wheels) and relating feedthroughs. This increases the present invention's compatibility with ultra-high vacuum (UHV) base pressure requirements of vacuum and low-pressure fabrication equipment systems such as some rapid thermal CVD systems. Furthermore, elimination of mechanical gear or rotational feedthrough sources of rotational force, the present invention increases the overall equipment reliability and uptime.

By applying controlled amounts of multi-phase electrical currents with a controlled frequency to the actuator coils 27, the rotor assembly 28 can be rotated at a controlled rotational speed. The rotation speed at any time can be controlled by the frequency of the multi-phase current sources. The amount of rotation torque can be controlled by adjusting the magnitude of electrical currents amplitudes flowing through the stator coils 27.

For maximum rotational torque generation, the stator coils 27 are mounted such that they contact the outer housing wall of the rotor assembly to minimize the magnetic air gap. Preferably, the rotor outer housing 25 wall has a thickness between two and four millimeters at the position where the stator coils 27 contact the rotor outer housing 25. A smaller rotor outer wall thickness will increase the amount of torque on the rotor assembly for a given "ampere-turn" applied of the stator coils 27. Ampere-turn is the product of the current applied to the winding and the number of turns around the winding for each stator coil 27. During typical operation in an RTP fabrication equipment, the fully loaded rotor weight runs between ten to fifty pounds, the rotation speed up to several hundred revolutions per minute (RPM), and the acceleration/deceleration values range from approximately 3 RPM/second up to approximately 50 RPM/second. Under these typical operating conditions, each stator actuator coil 27 must be capable of providing several hundreds of ampere-turns without overheating. Mounting the stator coils 27 in contact with the rotor assembly outer housing 25 not only improves the rotational drive capacity of the rotation system, but also improves thermal management of the stator assembly 28 due to the additional heat sinking effect of the rotor outer housing 25 on the actuator coils 27.

Figure 5:
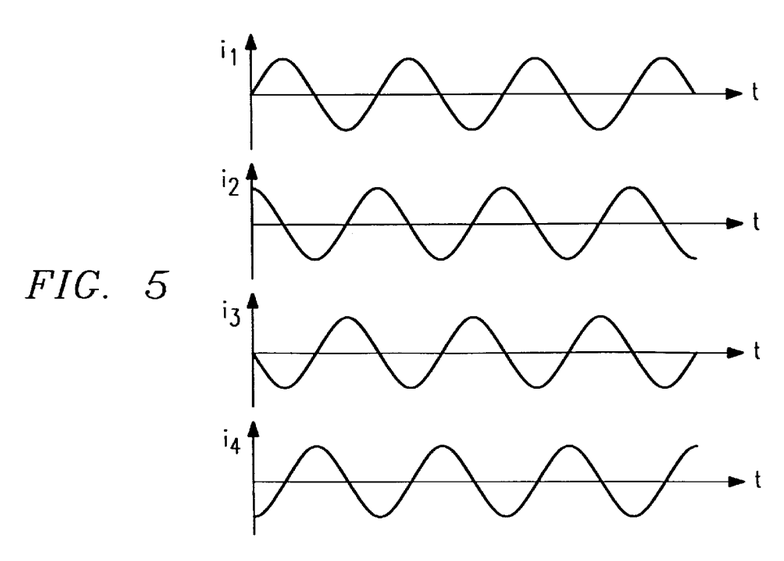
FIG. 5 shows one embodiment of the waveforms of the electrical currents applied to the stator coils in conjunction with the present invention.

In the preferred embodiment, the stator actuator coils 27 of the present invention are connected to a quadrature drive system. The quadrature power driver provides electrical currents (or voltages) in the following form:

$i_1 = I_{01} \sin(\omega t)$; $i_2 = I_{02} \cos(\omega t)$ $i_3 = I_{03} \sin(\omega t)$; $i_4 = -I_{04} \cos(\omega t)$ where we may use $I_0 \Delta I_{01} = I_{02} = I_{03} = I_{04}$ as the peak current levels for all channels. In the above case, the stator drive signals are assumed to be sinusoidal. Other types of waveforms, however, may also be used. These include triangular, square wave, etc. The number of separation in phase 1 can also be varies (3, 4, 5, etc.). The stator actuator coils are divided into four groups and each group is connected (in parallel; in series; or a combination of parallel and series) to one of the quadrature current drivers. For instance:

$i_1 = I_0 \sin \omega t$ to $S_{11}, S_{21}, S_{31}, S_{41}, S_{51}, S_{61}, S_{71}, S_{81}$, $i_2 = I_0 \cos \omega t$ to $S_{12}, S_{22}, S_{32}, S_{42}, S_{52}, S_{62}, S_{72}, S_{82}$, $i_3 = -I_0 \sin \omega t$ to $S_{13}, S_{23}, S_{33}, S_{43}, S_{53}, S_{63}, S_{73}, S_{83}$, $i_4 = -I_0 \cos \omega t$ to $S_{14}, S_{24}, S_{34}, S_{44}, S_{54}, S_{64}, S_{74}, S_{84}$, FIG. 5 illustrates typical waveforms for $i_1$, $i_2$, $i_3$, and $i_4$. The graphs on FIG. 5 plot the current waveform over time. One period of the drive signal results in rotation of the rotor by ⅛ turn. As a result, the rotation frequency as a fraction of the drive signal frequency is as follows:

$$RPM = (f/8) \times 60$$

For instance, a drive signal frequency of 24 Hz will result in a rotor rotation speed of 180 RPM. Note that the direction of rotation can be changed between the clockwise and counter-clockwise directions by the applied power supplies via phase control.

The rotation system may use an optical or magnetic home sensor 55 in order to stop the rotor assembly 22, and therefore the wafer 30, at a specified angular coordinate or position defined with respect to the rotor 24. In one embodiment, the present invention can incorporate an optical home sensor 55 on an optical viewport 56 mounted to the rotor assembly outer housing 25 (or the rotor inner housing 23 if the stator assembly has been place adjacent the rotor inner housing) and an optical marker placed on the rotor 24. To lock the rotor 24 in a pre-specified home position, one may apply $I_0$, 0 (zero), $-I_0$, and 0 (zero) currents to the four sets of coils. This will lock the multipolar magnets 26 into a pre-specified angular home position.

A rotation ramp-up from a stationary state may begin by gradually ramping up the quadrature drive frequency from zero to the steady-state rotational frequency value. For instance, to establish a 120 RPM rotation, the quadrature signal frequency may be ramped up from 0 to 16 Hz in about 5 seconds. In order to stop the rotation, the quadrature drive frequency can be ramped down from its steady-state value to a relatively low value (e.g., 1 Hz) until the home position is detected. As soon as the home position is detected, the process control computer can lock the rotor into its stationary home position by applying the DC current levels ($I_0$, 0, $-I_0$, 0) to the four groups of stator coils.

Figure 6:
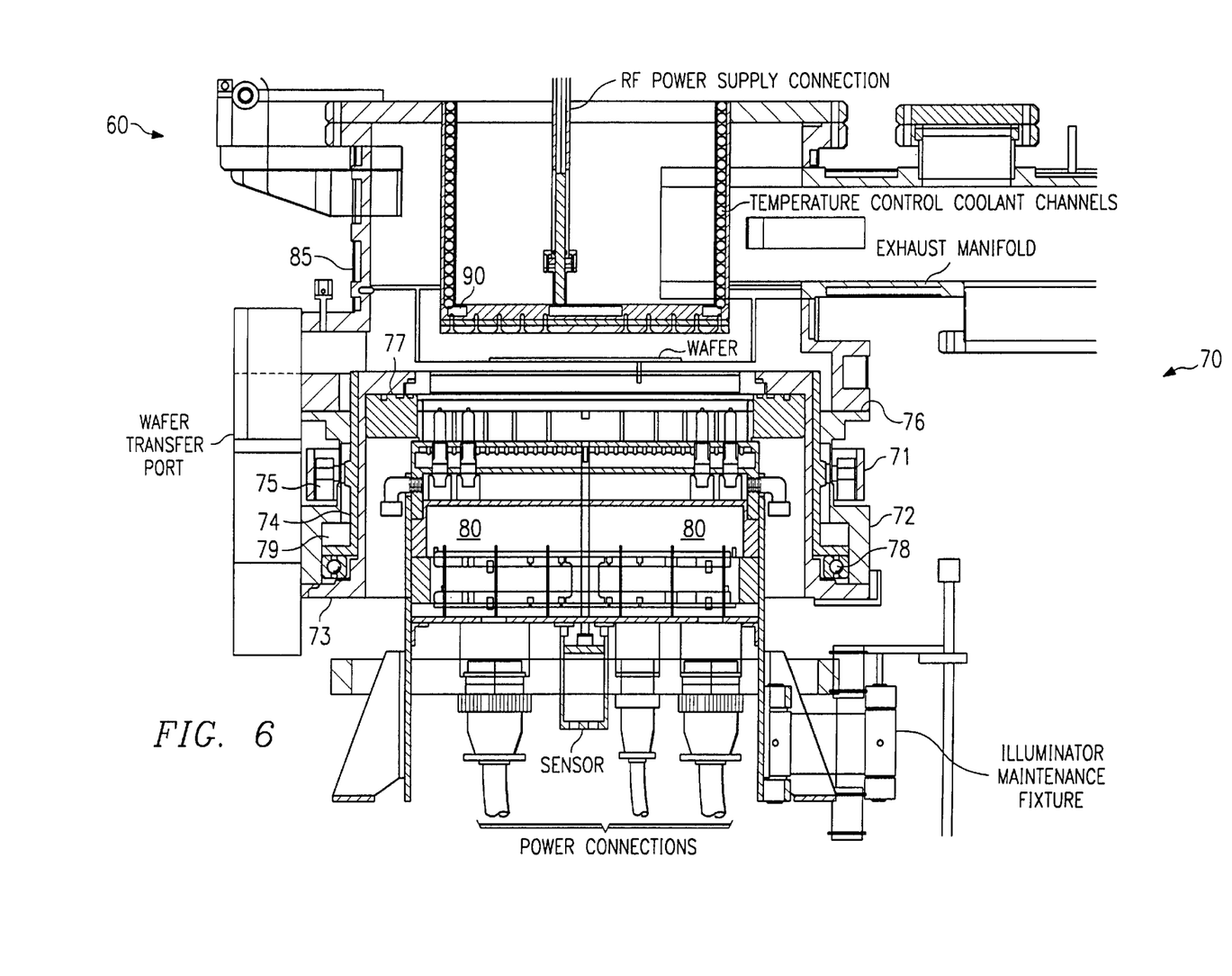
FIG. 6 shows a cross-sectional assembly drawing of one embodiment of the rotation assembly of the current invention in a multi-zone RTP equipment.

The embodiment described by FIGS. 2 through 5 show the application of the ultraclean rotation assembly of this invention to an advanced RTP system using backside wafer heating. The rotation assembly 20 of this invention can be implemented as a peripheral assembly without occupying the much-needed spaces directly above or below the wafer 30. As a result, these spaces remain available for implementation of the process energy sources and equipment assemblies. For instance, the rotation assembly 20 of the present invention can be used in conjunction with a multi-zone illuminator for wafer backside heating as illustrated in FIG. 4 and the more detailed schematic diagram of FIG. 6. FIG. 6 shows a more detailed schematic diagram of a preferred embodiment of the electromagnetic rotation assembly of this invention implemented in a rapid thermal processing (RTP) equipment 60. Various system components and subassemblies can be identified such as the rotation assembly 70, the multi-zone illuminator 80, the RTP process chamber 85, and the multi-zone showerhead assembly 90. The rotation assembly 70 includes the stator 71, the rotor outer housing 72, the rotor inner housing 73, and the rotor section 74. The external stator supports the stator coils 75 (there are 32 coils in this design). The rotor outer housing 72 and the rotor inner housing 73 connect to the RTP process chamber 85 via their respective contact flanges 76 and 77. The rotor section is supported on the mechanical bearing 78 at the bottom of the rotor chamber 79. The external stator 71 and the internal rotor 74 can be moved up and down in order to move the wafer up and down to allow wafer handling.

Additionally, a highly reflective showerhead can be located above the wafer 30 for pattern-independent RTP uniformity control and process gas injection. This type of equipment configuration is possible due to the annular design of the rotation assembly 20 which can accommodate the (RTP) multi-zone illuminator within the volume surrounded by the rotor assembly inner housing 23 directly under the quartz window and the water within the process chamber.

In summary, the present invention provides an apparatus and method for wafer rotation in microelectronics manufacturing equipment such as RTP and CVD equipment for semiconductor device fabrication. The present invention combines an external stator assembly having a plurality of electromagnetic actuator coils with a rotor assembly having a plurality of multipolar permanent magnets (or ferromagnetic tabs or pole pieces). The rotor assembly supports the semiconductor wafer or any other substrate within the process chamber. The electromagnetic actuator coils of the stator assembly receive multi-phase synchronized electrical currents to create magnetic fields around the actuator coils that interact with the magnetic fields of the multipolar permanent magnets (or with the ferromagnetic tabs) of the rotor assembly to provide the rotational force to rotate the rotor assembly and thus, rotate the wafer inside the fabrication process chamber.

Although the invention has been described in detail, it should be understood that various changes, substitutions, and alterations can be made hereto without departing from the spirit and scope of the invention as defined by the appended claims.

What is claimed is:

1. An apparatus for rotation of a substrate in device fabrication equipment, comprising:
    a stator assembly, the stator assembly further comprising:
        a stator support structure; and
        a plurality of electromagnetic actuator coils coupled to a support structure, said electromagnetic actuator coils operable to receive electrical current, thereby creating time varying magnetic fields around the actuator coils; and
    a rotor assembly, the rotor assembly further comprising:
        a rotor section operable to rotate about a rotation axis, the rotor section further operable to support said substrate distal the rotation axis;
        a rotor assembly housing for housing the rotor section, the rotor assembly housing further comprising an inner rotor housing coupled to an outer rotor housing to form a channel; and
        a plurality of multipolar permanent magnets arranged over said rotor section, the multipolar permanent magnets having magnetic fields operable to interact with the magnetic fields of the actuator coils to provide a rotational force to rotate the rotor assembly and said substrate, and wherein the plurality of multipolar magnets rotate within the channel of the rotor assembly housing.

2. The apparatus of claim 1 wherein said stator assembly further comprises a home sensor mounted to the rotor housing and at least four sets of electromagnetic actuator coils, the home sensor and electromagetic actuator coils operating in conjunction to lock the multipolar magnets into a pre-specified angular location.

3. The apparatus of claim 2 wherein the plurality of electromagnetic actuator coils comprises a number of coils equal to an integer multiple of four.

4. The apparatus of claim 2 wherein the electrical current received by the plurality of electromagnetic actuator coils has a phase, and wherein the plurality of electromagnetic actuator coils comprise a number of coils equal to an integer multiple of the phase used.

5. The apparatus of claim 2 wherein each of the electromagnet actuator coils comprises a coil winding wound about a high-permeability magnetic core section comprising an outer surface, and further wherein the support structure of said stator assembly further comprises at least one magnetic band made of a high-magnetic-permeability material, and wherein the electromagnetic actuator coils couple to the band such that the outer surface of the magnetic core sections of the electromagnetic actuator coils contact the band, and further wherein the electrical current creates a magnetic flux flowing from the outer surface, and wherein the magnetic band provides a low magnetic-reluctance path for effective closure of the magnetic flux.

6. The apparatus of claim 1, wherein the inner rotor housing is sealed below the substrate such that the channel can be evacuated while a substantial portion of a space below the substrate can be maintained at approximately atmospheric pressure.

7. The apparatus of claim 6, wherein the stator assembly and rotor assembly are arranged peripherally so as to avoid occupying a substantial portion of the space above or below the substrate, and further comprising an energy source positioned below the substrate within atmospheric pressure to provide backside substrate heating.

8. The apparatus of claim 1 wherein the rotor section rests upon a bearing located within the channel between the outer rotor housing and the inner rotor housing distal the substrate such that the bearing is substantially isolated from the substrate, the bearing operable to allow the rotor section to rotate due to an interaction of the magnetic fields of the actuator coils and the multipolar magnets.

9. The apparatus of claim 8 wherein the rotor housing further comprises a purge gas outlet located distal the substrate through which a purge gas exits the rotor housing.

10. The apparatus of claim 9 wherein said multipolar permanent magnets are arranged with substantially equal spacings from each other around said rotor section.

11. The apparatus of claim 10 wherein said multipolar permanent magnets are mounted on a magnetically permeable band, and further wherein said magnetically permeable band is coupled to the rotor section.

12. The apparatus of claim 11 wherein the rotor section is made of a magnetically permeable material.

13. The apparatus of claim 1 wherein the inner rotor housing is operable to support a process chamber window for rapid thermal processing equipment.

14. The apparatus of claim 1 wherein the rotor further comprises a contact interface operable to couple to a substrate support module, the substrate support module operable to support the substrate within the process chamber in said device fabrication equipment.

15. The apparatus of claim 1 wherein the rotor section is substantially cylindrical in shape.

16. The apparatus of claim 1 wherein said microelectronics manufacturing equipment is a single-wafer fabrication equipment.

17. The apparatus of claim 16 wherein said single-wafer fabrication equipment is a rapid thermal processing equipment.

18. The apparatus of claim 16 wherein said single-wafer fabrication equipment is a chemical-vapor deposition equipment.

19. The apparatus of claim 1 wherein the plurality of multipolar permanent magnets comprises a number of multipolar permanent magnets, and wherein the plurality of electromagnet actuator coils comprises a number that is twice the number of multipolar permanent magnets.

20. The apparatus of claim 1 wherein the plurality of multipolar permanent magnets comprises a number of multipolar permanent magnets, and wherein the plurality of electromagnet actuator coils comprises a number that is equal to the number of multipolar permanent magnets.

21. The apparatus of claim 1 wherein the plurality of multipolar permanent magnets comprises a number of multipolar permanent magnets, and wherein the plurality of electromagnet actuator coils comprises a number that is half of the number of multipolar permanent magnets.

22. The apparatus of claim 1 wherein the plurality of multipolar permanent magnets comprises a number of multipolar permanent magnets, and wherein the plurality of electromagnet actuator coils comprises a number that is one quarter the number of multipolar permanent magnets.

23. The apparatus of claim 1 further comprising a computer system coupled to the stator assembly, the computer system operable to instruct at least one electric power source to provide controlled amounts of electrical currents to the actuator coils.

24. An apparatus for rotation of a substrate in microelectronics manufacturing equipment, comprising:
an external stator assembly with a plurality of electromagnetic activator coils;
a rotor assembly with a plurality of magnetic components implemented as a peripheral assembly, wherein the rotor assembly further comprises an inner rotor housing coupled to an outer rotor housing to form a channel, and wherein the plurality of magnetic components rotate within the channel of the rotor assembly housing; and
a multi-phase alternating-current electrical power source for driving said electromagnetic activator coils.

25. The apparatus of claim 24 wherein said magnetic components are multi-phase permanent magnets.

26. The apparatus of claim 24 wherein said magnetic components are ferromagnetic tabs.

27. The apparatus of claim 24 wherein said microelectronics manufacturing equipment is a semiconductor manufacturing equipment.

28. The apparatus of claim 27 wherein said semiconductor manufacturing equipment is a rapid thermal processing equipment.

29. The apparatus of claim 24 wherein said semiconductor manufacturing equipment is a chemical-vapor deposition equipment.

30. An electromagnetic rotation apparatus for semiconductor fabrication equipment, comprising:
a substantially cylindrical rotor assembly with a plurality of electromagnetic activation coils;
a substantially cylindrical rotor assembly with a plurality of magnetic components on a rotor section, the rotor assembly for operationally supporting a wafer without occupying space above or below the water, wherein the rotor assembly further comprises an inner rotor housing coupled to an outer rotor housing to form a channel, and wherein the plurality of magnetic components rotate within the channel of the rotor assembly housing; and
a multi-phase controlled-frequency power supply for driving said electromagnetic activation coils.

31. The apparatus of claim 30 wherein said rotor assembly is an annular structure.

32. The apparatus of claim 31 wherein said semiconductor fabrication equipment is a rapid thermal processing equipment.

33. The apparatus of claim 32 wherein said rapid thermal processing equipment comprise, a multi-zone illuminator surrounded by said electromagnetic rotation apparatus for backside water heating.

34. An apparatus for rotation of a substrate in device fabrication equipment, comprising:
a stator assembly, the stator assembly further comprising;
a stator support structure; and
a plurality of electromagnetic actuator coils coupled to said support structure, said electromagnetic actuator coils operable to receive electrical current, thereby creating time varying magnetic field around the actuator coils; and
a rotor assembly, the rotor assembly further comprising:
a rotor section operable to rotate about a rotational axis and to support said substrate;
a rotor assembly housing rotationally coupled to the rotor section distal the rotational axis;
an inner rotor housing coupled to an outer rotor housing to form a channel; and
a plurality of ferromagnetic coupling tabs arranged over said rotor section, the tabs being arranged in submultiples of the coils designed to interact with the magnetic fields, wherein the plurality of ferromagnetic coupling tabs rotate within the channel of the rotor assembly housing.

35. The apparatus of claim 1 wherein the number of ferromagnetic coupling tabs is half the number of electromagnetic actuator coils.

36. The apparatus of claim 34 wherein the plurality of ferromagnetic coupling tabs comprises a number of ferromagnetic coupling tabs, and wherein the number of ferromagnetic coupling tabs is three times the number of electromagnetic actuator coils.

37. The apparatus of claim 34 wherein the plurality of ferromagnetic coupling tabs comprises a number of ferromagnetic coupling tabs, and wherein the number of ferromagnetic coupling tabs is four times the number of electromagnetic actuator coils.

38. The apparatus of claim 34 wherein the plurality of ferromagnetic coupling tabs comprises a number of ferromagnetic coupling tabs, and wherein the number of ferromagnetic coupling tabs is six times the number of electromagnetic actuator coils.

39. The apparatus of claim 34 wherein the plurality of ferromagnetic coupling tabs comprises a number of ferromagnetic coupling tabs, and wherein the number of ferromagnetic coupling tabs is eight times the number of electromagnetic actuator coils.

40. The apparatus of claim 34 wherein ferromagnetic coupling tabs are arranged with substantially equal spacings from each other around said rotor section.

41. The apparatus of claim 34 wherein said ferromagnetic tabs, and further wherein said magnetically permeable band is coupled to the rotor section.

* * * * *